United States Patent
Soman et al.

(10) Patent No.: US 10,135,415 B2
(45) Date of Patent: Nov. 20, 2018

(54) METHOD TO REDUCE FREQUENCY DISTRIBUTION OF BULK ACOUSTIC WAVE RESONATORS DURING MANUFACTURING

(71) Applicant: Texas Instruments Incorporated, Dallas, TX (US)

(72) Inventors: Joel Soman, Dallas, TX (US); Iouri Mirgorodski, Sunnyvale, CA (US); Nicholas Stephen Dellas, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 228 days.

(21) Appl. No.: 14/973,958

(22) Filed: Dec. 18, 2015

(65) Prior Publication Data

US 2017/0179914 A1     Jun. 22, 2017

(51) Int. Cl.
   *H03H 3/007*     (2006.01)
   *H03H 3/04*     (2006.01)
   *G01H 13/00*     (2006.01)

(52) U.S. Cl.
   CPC .............. *H03H 3/04* (2013.01); *G01H 13/00* (2013.01); *H03H 2003/0428* (2013.01)

(58) Field of Classification Search
   CPC .. H03H 3/02; H03H 3/04; H03H 9/56; H03H 9/58; H03H 9/562; H03H 9/564; H03H 2003/0428; G01H 3/04
   See application file for complete search history.

(56) References Cited

U.S. PATENT DOCUMENTS

| | | | | |
|---|---|---|---|---|
| 5,815,054 A * | 9/1998 | Vojak | ................. | H03H 9/02543 310/320 |
| 5,872,493 A * | 2/1999 | Ella | ......................... | H03H 3/02 310/322 |
| 5,910,756 A * | 6/1999 | Ella | ...................... | H03H 9/0095 310/322 |
| 6,278,342 B1 * | 8/2001 | Ella | ........................ | H03H 9/568 310/321 |
| 6,407,649 B1 * | 6/2002 | Tikka | ................... | H03H 9/0571 29/25.35 |
| 6,441,702 B1 * | 8/2002 | Ella | ......................... | H03H 3/04 29/25.35 |
| 6,509,813 B2 * | 1/2003 | Ella | ......................... | H03H 3/02 29/25.35 |
| 6,518,860 B2 * | 2/2003 | Ella | ......................... | H03H 3/04 29/25.35 |
| 6,657,363 B1 * | 12/2003 | Aigner | .................... | H03H 3/04 310/312 |
| 6,839,946 B2 * | 1/2005 | Ylilammi | ................ | H03H 3/02 29/25.35 |
| 7,296,329 B1 * | 11/2007 | Barber | .................... | H03H 3/02 216/13 |
| 2007/0139140 A1 * | 6/2007 | Rao | ...................... | H03H 3/0076 333/188 |

* cited by examiner

*Primary Examiner* — Carl Arbes
(74) *Attorney, Agent, or Firm* — Jacqueline J. Garner; Charles A. Brill; Frank D. Cimino

(57) ABSTRACT

A method of tuning the resonant frequency of embedded bulk acoustic resonators during manufacturing of an integrated circuit. The rate of change in the resonant frequency of BAWs vs rate of change in top electrode thickness is determined and used to tune the resonant frequency of embedded bulk acoustic resonators during integrated circuit manufacturing.

17 Claims, 4 Drawing Sheets

METHOD TO REDUCE FREQUENCY DISTRIBUTION OF BULK ACOUSTIC WAVE RESONATORS DURING MANUFACTURING

FIELD OF THE INVENTION

This invention relates to the field of integrated circuits. More particularly, this invention relates to integrated circuits with bulk acoustic wave resonators.

BACKGROUND

Radio frequency (RF) filters are key components in any wireless system and as these systems continue to be miniaturized, the pressure on filter technology to shrink as well without compromising performance continues. Handheld systems and their associated volumes have generated strong interest in filter technologies that show promise for lower cost and smaller size. Bulk acoustic wave resonators may be built in an integrated circuit using standard integrated circuit manufacturing techniques, thereby offering low cost.

Typical bulk acoustic wave (BAW) resonators currently in production consist of a piezoelectric material sandwiched between a lower metallic electrode and an upper metallic electrode. When an alternating electric field is placed across the piezoelectric material by way of the electrodes, the piezoelectric structure mechanically deforms in a periodic manner and generates a standing acoustic wave.

The frequency of the acoustic wave depends upon the thickness of the piezoelectric material and the thickness or mass of the lower and upper metallic electrodes. Variation in the thickness of these materials across a semiconductor wafer results in variation in the frequency of the BAW resonator. When the specified range of the BAW resonator is narrow, significant yield loss may result from across wafer thickness non-uniformity of the piezoelectric material and the metallic electrode layers.

A typical BAW resonator is depicted in FIG. 1. The BAW resonator 110 consists of a piezoelectric material 104 sandwiched between a lower metal electrode 102 and an upper metal electrode 106. The BAW depicted in FIG. 1 is a solidly mounted resonator formed directly on a substrate 100 which may be an integrated circuit. Several layers of alternating low-acoustic and high-acoustic material form an underlying Bragg acoustic reflector 108. The layers in the Bragg acoustic reflector have a thickness corresponding to one-quarter of the wavelength of the fundamental resonant frequency of the BAW resonator 110 and reflect the resonant acoustic wave. A second Bragg acoustic reflector 112 may be formed over the BAW to additionally enhance the fundamental resonance frequency of the BAW resonator. Dielectric protective overcoat (PO) 114 is formed over the BAW and electrical contacts 116 and 118 are formed through openings in the PO to the bottom BAW resonator electrode 102 and top BAW resonator electrode 106.

Typically, the piezoelectric material is aluminum nitride (AlN) although zinc oxide (ZnO) or lead zirconium titanate (PZT) are also used. The bottom electrode 102 and top electrode 106 may be a metal such as molybdenum, titanium-tungsten alloy, titanium nitride, tantalum nitride, or other similar metallic material.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

The resonant frequency of embedded bulk acoustic resonators is tuned during manufacturing of an integrated circuit. The rate of change in the resonant frequency of BAWs vs rate of change in top electrode thickness is determined and is used to tune the resonant frequency of embedded bulk acoustic resonators during integrated circuit manufacturing. A method and equation for determining the rate of change in the resonant frequency of BAWs vs rate of change in top electrode thickness is described and a method and equations for using the rate of change data to tune the resonant frequency of embedded bulk acoustic resonators during integrated circuit manufacturing is presented.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
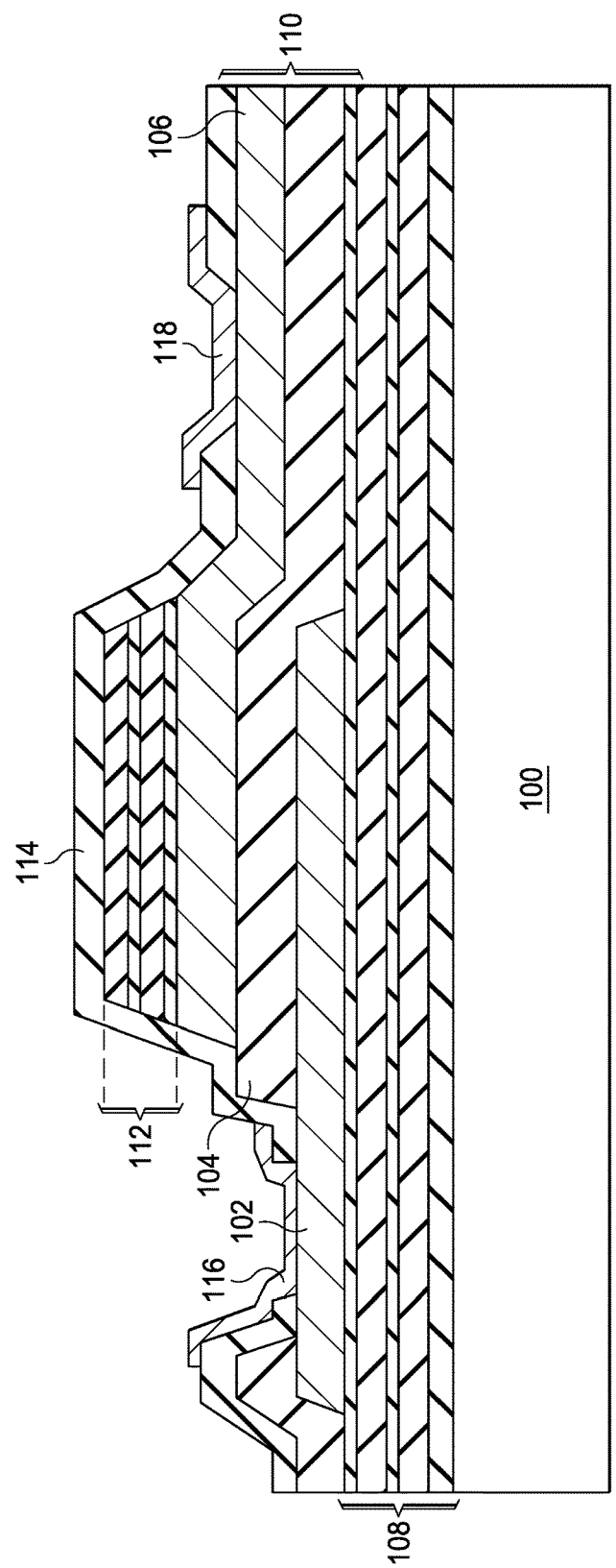
FIG. 1 (Prior art) is a cross-section of an integrated circuit with a bulk acoustic wave resonator processed through top electrode formation.

Frequently because of across wafer thickness variation in the BAW resonator 110 (FIG. 1) bottom electrode 102 material, across wafer thickness variation in the BAW resonator 110 piezoelectric material 104, and across wafer thickness variation in the top electrode 106 material, the fundamental resonant frequency of BAW resonators varies across the wafer. This across wafer variation in the BAW resonant frequency can result in significant yield loss.

The fundamental resonant frequency of a BAW resonator is a function of the thicknesses of the piezoelectric material 104 (FIG. 1), and of the thicknesses of the bottom 102 and top 106 BAW resonator electrode material. A method is described which quantifies the change in fundamental resonant frequency (resonant frequency) of the BAW resonator as a function of the thickness of the top electrode 106 material. A method is then described in which different amounts of top electrode material are sequentially removed from BAW resonators on a production wafer to significantly reduce the variation in the resonant frequency across the production wafer. The tightened resonant frequency distribution can significantly increase yield and reduce cost.

Figure 3:
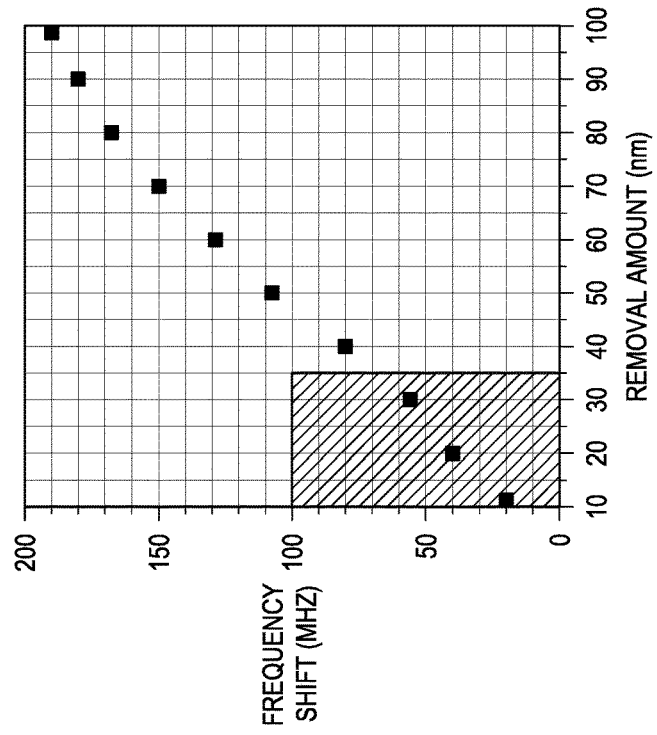
FIG. 3 is a graph of change in the resonant frequency of a bulk acoustic wave resonator as a function of the thickness of top electrode material.
Figure 2:
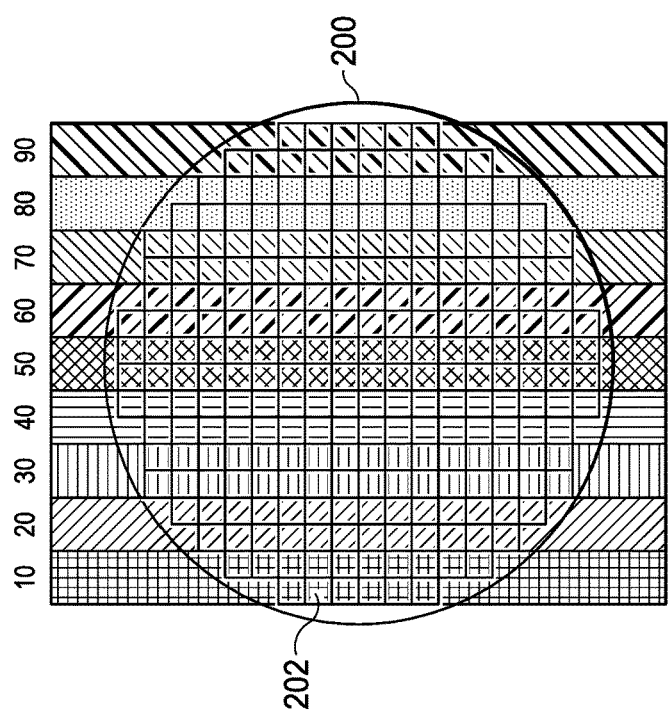
FIG. 2 is a plan view of a calibration wafer.
Figure 4:
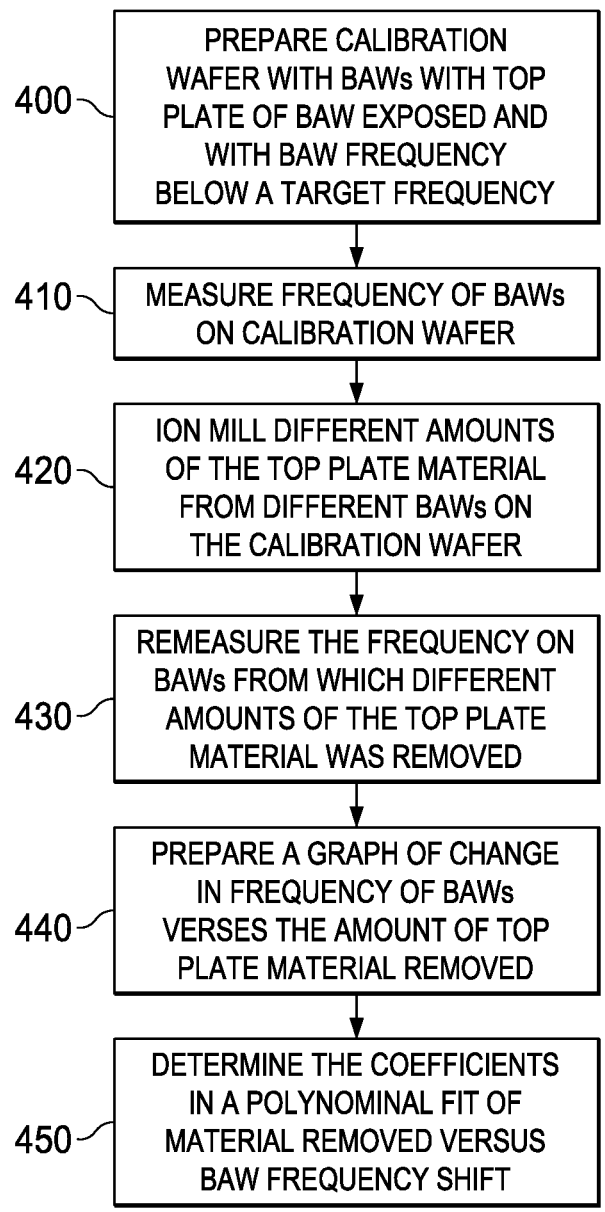
FIG. 4 is a flow diagram describing an embodiment method for quantifying the change in resonant frequency of a bulk acoustic wave resonator as a function of the thickness of the top electrode removed.

A method for quantifying the change in the resonant frequency of a BAW resonator as a function of the thickness of top electrode removed is described in FIGS. 2, 3, and 4.

FIG. 2 shows a calibration wafer 200 with integrated circuit chips 202 containing BAW resonators that have been processed through deposition, patterning, and etching of the BAW top electrode material. (Step 400, in FIG. 4). The calibration wafer may be a wafer taken from a production lot. The top plate material 106 (FIG. 1) is deposited slightly thick so that the resonant frequency of the BAW resonators on the calibration wafer is in the range of about 5% to 7% lower than a than the target frequency.

In step 410 of FIG. 4, the resonant frequency of a subset of the BAW resonators on the calibration wafer is measured. A subset is typically chosen because it takes too long to measure all the BAW resonators on the wafer. The size of the subset depends upon the non-uniformity of the resonant frequency changes across the calibration wafer which in turn depends upon the across wafer thickness non-uniformity of the bottom electrode 102, the piezoelectric material 106, and the top electrode 106 material.

In step 420 of FIG. 4, different thicknesses of the top plate material are ion milled from BAW resonators on the calibration wafer. As is illustrated in FIG. 2, 10 nm is removed from the first two columns of die, 20 nm is removed from the second two columns, and so on across the calibration wafer. The removal may be on columns of die, rows of die, or some other pattern. The amount of top material removed in each of the sections is selected depending upon the particulars of the BAW resonator being tuned and on the final across wafer resonant frequency variation required.

In step 430 of FIG. 4, the resonant frequency of the subset of BAW resonators is re-measured and the change in frequency of the BAW resonators is calculated.

In step 440 of FIG. 4 the change in resonant frequency of the BAW 310 is plotted as a function of thickness of the BAW top electrode material that is ion milled away. In the illustrative example graph in FIG. 3 when 30 nm of top electrode is ion milled away the resonant frequency of the BAW resonator increases about 55 MHZ.

In step 450 of FIG. 4 the data is fitted to a polynomial such as the $6^{th}$ order polynomial equation A1 to determine the polynomial coefficients, t, u, v, w, x, y, and z. The value of the polynomial coefficients depends upon the structure of the BAW resonator, upon the top and bottom electrode materials, and upon the piezoelectric material. For an example embodiment BAW resonator some of the polynomial coefficients are listed in TABLE 2 for molybdenum as a top electrode material and for titanium-tungsten alloy as a top electrode material.

$$r_i = t(fs_i)^6 + u(fs_i)^5 + v(fs_i)^4 + w(fs_i)^3 + x(fs_i)^2 + y(fs_i)^1 + z \qquad \text{A1}$$

$fs_i$=resonate frequency shift
$r_i$=removal amount
t, u, v, w, x, y, and z=polynomial coefficients

TABLE 1

|   | Mo | TiW |
|---|---|---|
| w | 1.481E−6 | 2.062E−4 |
| x | −.056E−4 | −5.368E−3 |
| y | 0.058E−2 | 12.238E−2 |
| z | 0 | 2.00E−1 |

Figure 5:
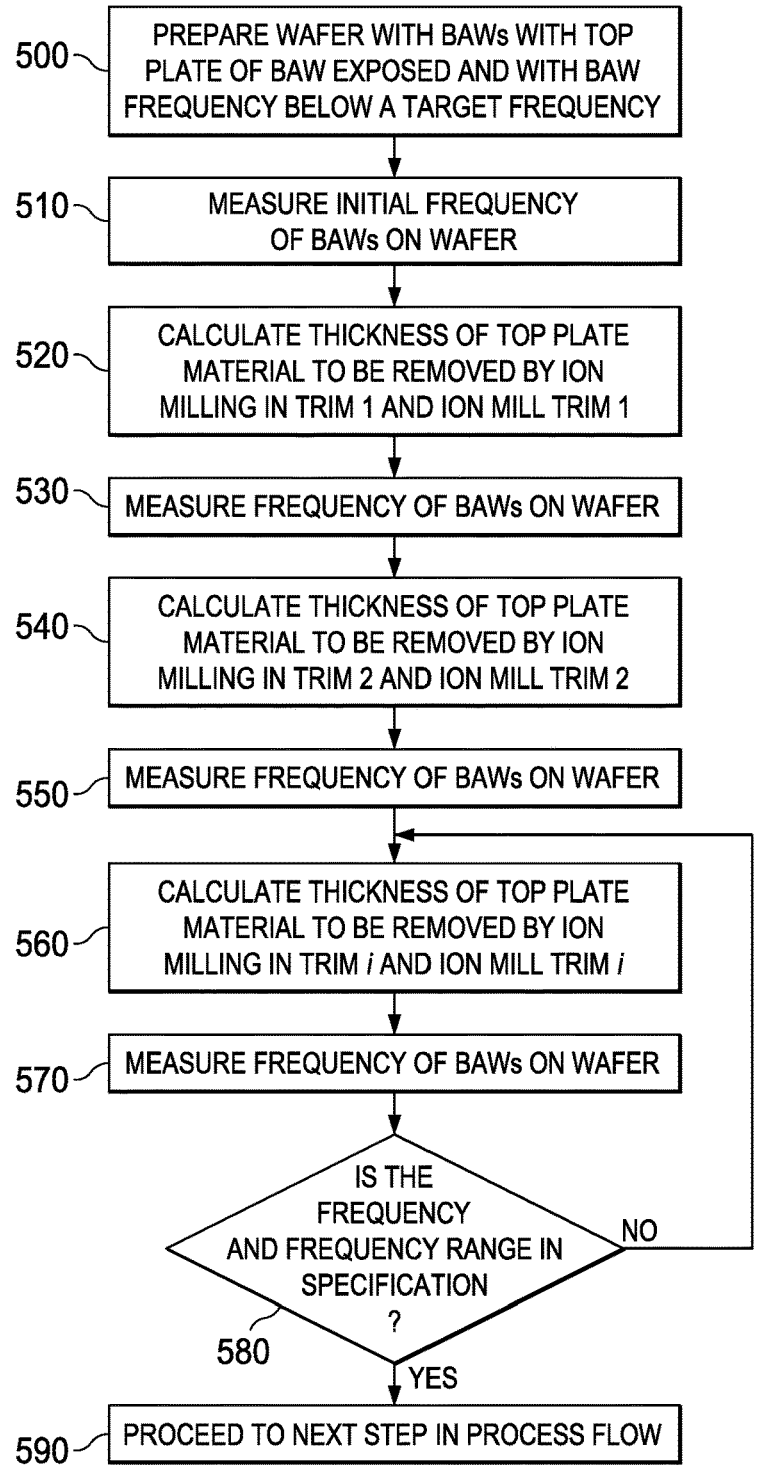
FIG. 5 is a flow diagram describing an embodiment method for tuning the resonant frequency of an embedded bulk acoustic waver resonator during manufacturing of an integrated circuit.

A method that uses several passes of ion milling to tighten the resonant frequency distribution of BAW resonators on an integrated circuit production wafer is described in the flow diagram of FIG. 5. The tightest final across wafer resonant frequency distribution is achieved by removing a smaller thickness in each successive ion milling pass.

In step 510 of FIG. 5 the initial resonant frequency, $f_0$, of BAW resonators on a subset of integrated circuit chips on a production wafer is measured. The top electrode material 106 (FIG. 1) is deposited slightly thick so that the resonant frequency of the BAW resonators is 4% to 7% below the target resonant frequency. The subset of BAW resonators is chosen to be representative of the variation in resonant frequency of the BAW resonators on the integrated circuit chips across the wafer. In an example embodiment the target frequency, $f_t$, is 2.45 GHz and the initial measured frequency, $f_0$, is 2.3 GHz.

It has been discovered that the tightest across wafer resonant frequency distribution is achieved by removing portions of the top electrode material sequentially and removing lesser amounts of the top plate material in each successive step. The number of top electrode removal steps (trim steps) depends upon the tightness of the final across wafer resonant frequency distribution required. In an example embodiment of a BAW resonator with a target resonant frequency of 2.45 GHz, four trim steps reduced the across production wafer resonant frequency variation from about 0.5% across wafer to about 0.06%.

In step 520 the first thickness, $r_1$, of top electrode material to be removed to create a first frequency shift, $fs_1$, is calculated using equation A2 and the polynomial coefficients in from TABLE 1. A different trim 1 removal amount, $r_1$, is calculated for each of the BAW resonators that are measured in the subset. The removal amounts are then programmed into an ion mill which removes the specified top electrode thickness of from each of the BAW resonators that are measured in the subset and from the BAW resonators in the neighborhood of the BAW resonators that are measured. The amount of top plate material removed from a BAW resonator that lies between two BAW resonators that were measured may be an interpolated $r_1$ that may be a function of the distance to each of the BAW resonators whose resonated frequency is measured. In an illustrative example, trim 1 is targeted to change the resonant frequency about 35% to 45% of the difference between the measured frequency, $f_0$, and the final target resonant frequency. In an example embodiment, the target frequency $f_t$, is 2.45 MHz, the initial measured frequency, $f_0$, is 2.3 GHz, and the target trim 1 frequency shift, $fs_1$, is 0.06 GHz.

$$r_1 = t(fs_1)^6 + u(fs_1)^5 + v(fs_1)^4 + w(fs_1)^3 + x(fs_1)^2 + y(fs_1)^1 + z \qquad \text{A2}$$

In step 530, after trim 1, the first BAW resonant frequency, $f_1$, is measured on a subset of integrated circuit chips on the production wafer.

In step 540 the second thickness, $r_2$, of top electrode material to be removed to create a second frequency shift, $fs_2$, is calculated using equation A3. A different trim 2 removal amount, $r_2$, is calculated for each of the BAW resonators that are measured in the subset. The removal amounts are then programmed into an ion mill which removes the specified top electrode thickness of from each of the BAW resonators that are measured in the subset. The ion mill may also remove top plate material from BAW resonators that were not measured that are in the neighborhood of BAW resonators that were measured. The thickness removed may be the calculated thickness or may be an interpolated. In an illustrative example, trim 2 is targeted to change the resonant frequency about 50% to 60% of the way between the resonant frequency measured in step 530 and the final target resonant frequency, $f_t$. In an example embodiment, the target frequency $f_t$, is 2.45 MHz, the measured frequency, $f_t$, is 2.36 GHz, and the trim 2 frequency shift, $f_{S2}$, is 0.04 GHz.

$$r_2 = \frac{((fs_2)(r_1))}{(f_1 - f_0)} \qquad A3$$

In step 550, the post trim 2 BAW resonant frequency, $f_2$, is measured on a subset of integrated circuit chips on the production wafer.

In step 560 with i=3 the trim thickness, $r_i$, of top electrode material to be removed to create a frequency shift, $fs_i$, is calculated using equations A4, A5, and A6. A different trim i removal amount, $r_i$, is calculated for each of the BAW resonators that are measured in the subset. The calculated removal amounts are then programmed into an ion mill which removes the specified top electrode thickness of from each of the BAW resonators that are measured in the subset and from the BAW resonators in the neighborhood of the BAW resonators that are measured. The thickness removed from the BAW resonators in the neighborhood may be an interpolated thickness instead of the calculated thickness. In an illustrative example, trim 3 is targeted to change the resonant frequency about 60% to 70% of the way between the resonant frequency measured in step 530 and the final target resonant frequency, $f_t$. In an example embodiment, the target frequency $f_1$, is 2.45 MHz, the measured frequency, $f_2$, is 2.40 GHz, and the trim 3 frequency shift, $f_{S3}$, is 0.03 GHz.

In step 570, the post trim 3 BAW resonant frequency, $f_3$, is measured on a subset of integrated circuit chips on the production wafer.

$$r_i = \frac{-C_1 \pm \sqrt{C_1^2 + 4C_2(ft_i - f_{i-3})}}{\frac{C_2}{2}} - r_{i-1} - r_{i-2} \qquad A4$$

$$C_1 = \frac{(f_{i-2} - f_{i-3})\left(\frac{r_{i-2} + r_{i-1}}{r_{i-2}}\right) - (f_{i-1} - f_{i-3})\left(\frac{r_{i-2}}{r_{i-2} + r_{i-1}}\right)}{r_{i-1}} \qquad A5$$

$$C_2 = \frac{(f_{i-3} - f_{i-2}) - (f_{i-3} - f_{i-1})\left(\frac{r_{i-2}}{r_{i-2} + r_{i-1}}\right)}{\frac{r_{i-2}}{r_{i-1}}} \qquad A6$$

In step 580 the measured frequency, $f_3$, is compared to the final target frequency, $f_t$. If the measured frequency, $f_3$, is not within the specified target range the thickness, $r_i$, where i=4 is calculated using equations A4, A5, and A6. A different trim 4 removal amount, $r_4$, is calculated for each of the BAW resonators that are measured in the subset. The calculated removal amounts are then programmed into an ion mill which removes the specified top electrode thickness of from each of the BAW resonators in the subset and from BAW resonators in the neighborhood of the BAW resonators that are measured. The thickness removed from BAW resonators in the neighborhood may be an interpolated thickness. In an illustrative example, trim i with i>3 is targeted to change the resonant frequency 100% of the way between the resonant frequency, $f_i$, measured in step 580 and the final target resonant frequency, $f_t$. In an example embodiment, the target frequency $f_t$, is 2.45 MHz, the measured frequency, $f_3$, is 2.43 GHz, and the trim 4 frequency shift, $f_{S4}$, is 0.02 GHz.

Steps 560, 570, and 580 may be repeated as many times as needed to tune the resonant frequency of the BAW resonators across the wafer to within specification. From experience, three or four tuning cycles may be used to hit the target across wafer resonant frequency distribution. If the top electrode is deposited thick so that the initial frequency is more than 7% lower than the target frequency, additional cycles may be used.

When the resonant frequency of the BAW resonators measured in step 580 meets target specifications, the wafers are moved on to step 590 for further processing. The additional processing may include forming a second Bragg reflector on the top electrode of the BAW resonator, and adding additional layers of dielectric and interconnect to complete the integrated circuit.

The embodiment method of tuning the resonant frequency of BAW resonators during manufacturing on an integrated circuit wafer, significantly reduces the variability in the resonant frequency of BAW resonators across an integrated circuit wafer. This results in higher yield and reduced cost.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit with a BAW resonator, comprising the steps:
   partially processing an integrated circuit wafer with the BAW resonator through formation of a top electrode material wherein the top electrode material has a thickness that results in an initial resonant frequency of the BAW below a target frequency;
   measuring a resonant frequency on a portion of the BAW resonators across the integrated circuit wafer;
   removing a portion of the top electrode material of the BAW resonators to raise the frequency of the BAW resonators;
   repeating the steps of measuring and removing a portion at least three times until the target frequency is achieved wherein a decreasing amount of the top electrode material is removed during each successive removing a portion step.

2. The process of claim 1, wherein the step of removing a portion is removed using ion milling.

3. The process of claim 1, wherein the initial resonant frequency of the BAW resonators is approximately 5% to 7% below a target frequency specification, wherein the resonant frequency of the BAW resonators is approximately 3% to 4% below the target frequency after a first cycle of ion milling; wherein the resonant frequency of the BAW resonators is approximately 2% to 3% below the target frequency after a second cycle of ion milling; wherein the resonant frequency of the BAW resonators is approximately 1% to 2% below the target frequency after a third cycle of ion milling, and wherein the resonant frequency of the BAW resonators is within a target frequency specification range after a fourth cycle of ion milling.

4. The process of claim 2, further comprising the steps:
calculating a thickness of the top electrode material to be removed during each ion milling cycle to raise the resonant frequency a target amount;
interpolating a thickness of the top electrode material to be removed from BAW resonators whose resonant frequency is not measured using resonant frequency data from BAW resonators in an adjacent area whose resonant frequency is measured;
sending the calculated thickness to be removed to an ion milling machine; and
sending the interpolated thickness to be removed to the ion milling machine.

5. The process of claim 1 further comprising the steps:
preparing a calibration wafer wherein a resonant frequency of BAW resonators on the calibration wafer is lower than the target frequency;
measuring the resonant frequency of BAW resonators on the calibration wafer;
removing different thicknesses, $r_i$, of top electrode material from different BAW resonators on the calibration wafer wherein the removing different thicknesses causes the resonant frequency of the different BAW resonators to rise different amounts;
measuring the resonate frequency shift, $f_{sci}$, for each thickness $r_{ci}$ on the calibration wafer;
using the measured resonate frequency shift $f_{sci}$ and corresponding removed thickness $r_{ci}$ to calculate a thickness of top electrode material to be removed to cause a target increase in resonant frequency of the BAW resonator on a production wafer; and
sending the calculated thickness of top electrode material to be removed to an ion milling machine.

6. The process of claim 5, wherein using the measured resonate frequency shift $f_{sci}$ and corresponding removed thickness $r_{ci}$ comprises solving the polynomial equation:

$$r_{ci} = t(f_{sci})^6 + u(f_{sci})^5 + v(f_{sci})^4 + w(f_{sci})^3 + x(f_{sci})^2 + y(f_{sci})^1 + z$$

wherein t, u, v, w, x, y, and z are polynomial coefficients.

7. The process of claim 6, further comprising the steps:
measuring an initial resonant frequency, $f_0$, of the BAW resonators on a production wafer;
using the polynomial coefficients t, u, v, w, x, y, and z determined from the calibration wafer to calculate a first thickness, $r_1$, of top electrode material to be removed to raise the initial resonant frequency, $f_0$, of the BAW resonators on the production wafer by a first delta frequency, $f_{S1}$ to a first resonant frequency, $f_1$, using the equation:

$$r_1 = t(fs_1)^6 + u(fs_1)^5 + v(fs_1)^4 + w(fs_1)^3 + x(fs_1)^2 + y(fs_1)^1 + z;$$

using the equation, $$r_2 = \frac{((fs_2)(r_1))}{(f_1 - f_0)},$$

to calculate a second thickness, $r_2$, of top electrode material to be removed to raise the first resonant frequency, $f_1$, on the BAW resonators on the production wafer by a second delta frequency, $f_{S2}$, to a second resonant frequency, $f_2$, and wherein the second thickness is less than the first thickness;

using the equation, $$r_3 = \frac{-C_1 \pm \sqrt{C_1^2 + 4C_2(f_3 - f_0)}}{\frac{C_2}{2}} - r_2 - r_1$$

wherein $$C_1 = \frac{(f_1 - f_0)\left(\frac{r_1 + r_2}{r_1}\right) - (f_2 - f_0)\left(\frac{r_1}{r_1 + r_2}\right)}{r_2}$$

and wherein $$C_2 = \frac{(f_0 - f_1) - (f_0 - f_2)\left(\frac{r_1}{r_1 + r_2}\right)}{\frac{r_1}{r_2}}$$

to calculate a third thickness, $r_3$, of top electrode material to be removed to raise the second resonant frequency, $f_2$, on the BAW resonators on the production wafer by a third delta frequency, $f_{S3}$, to a third resonant frequency, $f_3$; and wherein the third thickness is less than the second thickness;

using the equation, $$r_4 = \frac{-C_1 \pm \sqrt{C_1^2 + 4C_2(f_t - f_1)}}{\frac{C_2}{2}} - r_2 - r_3$$

wherein $$C_1 = \frac{(f_2 - f_1)\left(\frac{r_2 + r_3}{r_2}\right) - (f_3 - f_1)\left(\frac{r_2}{r_2 + r_3}\right)}{r_3}$$

and wherein $$C_2 = \frac{(f_1 - f_2) - (f_1 - f_3)\left(\frac{r_2}{r_2 + r_3}\right)}{\frac{r_2}{r_3}}$$

to calculate a fourth thickness, $r_4$, of top electrode material to be removed to raise the third resonant frequency, $f_3$, on the BAW resonators on the production wafer by a fourth delta frequency, $f_{S4}$, to the target frequency, $f_t$, and wherein the fourth thickness is less than the third thickness.

8. A process of forming an integrated circuit with BAW resonators, comprising the steps:
partially processing integrated circuit wafers with the BAW resonators through formation of a top electrode on the BAW resonators wherein the top electrode has a thickness that results in an initial resonant frequency of the BAW resonators below a target frequency;
selecting a calibration wafer wherein the calibration wafer is one of the integrated circuit wafers;
measuring the resonant frequency of a subset of the BAW resonators on the calibration wafer;
removing different amounts of top electrode from different BAW resonators on the calibration wafer;
re-measuring the resonant frequency of the subset of the BAW resonators and determining a rate in rise of a resonant frequency of the BAW resonator as a function of a thickness of top electrode material removed;

measuring the initial resonant frequency of a subset of the BAW resonators on production wafers wherein the production wafers are integrated circuit wafers;

using the data from the calibration wafer to calculate a first thickness of top electrode to be removed to raise the resonant frequency of the BAW resonators on the production wafers by a first delta frequency;

removing the first thickness;

measuring a first resonant frequency of the BAW resonators;

calculating a second thickness of top electrode to be removed to raise the resonant frequency of the BAW resonators on the production wafer by a second delta frequency wherein the second delta frequency is less than the first delta frequency;

removing the second thickness;

measuring a second resonant frequency of the BAW resonators;

calculating a third thickness of top electrode to be removed to raise the resonant frequency of the BAW resonators on the production wafer by a third delta frequency wherein the third delta frequency is less than the second delta frequency;

removing the third thickness;

measuring a third resonant frequency of the BAW resonators;

calculating a fourth thickness of top electrode to be removed to raise the resonant frequency of the BAW resonators on the production wafer by a fourth delta frequency to hit the target frequency;

removing the fourth thickness; and measuring a fourth resonant frequency of the BAW resonators.

9. The process of claim 8 where the steps of removing are ion milling steps.

10. The process of claim 8, wherein the initial resonant frequency of the BAW resonators is approximately 5% to 7% below a target frequency specification, wherein the first resonant frequency of the BAW resonators is approximately 3% to 4% below target; wherein the second resonant frequency of the BAW resonators is approximately 2% to 3% below target; wherein the third resonant frequency of the BAW resonators is approximately 1 to 2% below target after a third cycle of ion milling, and wherein the fourth resonant frequency of the BAW resonators is within a target frequency specification range.

11. The process of claim 8, wherein the step of determining the rate of rise of the resonant frequency of the BAW resonator as a function of the thickness of top electrode material removed comprises determining polynomial coefficients of a polynomial equation given by $$r_{ci} = t(f_{sci})^6 + u(f_{sci})^6 + v(f_{sci})^6 + w(f_{sci})^6 + x(f_{sci})^6 + y(f_{sci})^6 + z$$

wherein t, u, v, w, x, y, and z are polynomial coefficients; wherein $f_{sci}$ is the frequency shift caused by removal of $r_{ci}$ thickness of top electrode material and is calculated from the difference between the measured resonant frequency and the re-measured resonant frequency; and wherein $r_{ci}$ is the thickness of top electrode material removed.

12. The process of claim 11, further comprising the steps:

using the polynomial coefficients t, u, v, w, x, y, and z determined from the calibration wafer to calculate the first thickness, $r_1$, of top electrode material to be removed to raise the initial resonant frequency, $f_0$, of the BAW resonators on the production wafer by the first delta frequency, $f_{S1}$, to the first resonant frequency, $f_1$, using the equation:

$$r_1 = t(f s_1)^6 + u(f s_1)^5 + v(f s_1)^4 + w(f s_1)^3 + x(f s_1)^2 + y(f s_1)^1 + z;$$

using the equation, $$r_2 = \frac{((f s_2)(r_1))}{(f_1 - f_0)},$$

to calculate the second thickness, $r_2$, of top electrode material to be removed to raise the first resonant frequency, $f_1$, on the BAW resonators on the production wafer by the second delta frequency, $f_{S2}$, to the second resonant frequency, $f_2$, and wherein the second thickness is less than the first thickness;

using the equation, $$r_3 = \frac{-C_1 \pm \sqrt{C_1^2 + 4C_2(f_3 - f_0)}}{\frac{C_2}{2}} - r_2 - r_1$$

wherein $$C_1 = \frac{(f_1 - f_0)\left(\frac{r_1 + r_2}{r_1}\right) - (f_2 - f_0)\left(\frac{r_1}{r_1 + r_2}\right)}{r_2}$$

and wherein $$C_2 = \frac{(f_0 - f_1) - (f_0 - f_2)\left(\frac{r_1}{r_1 + r_2}\right)}{\frac{r_1}{r_2}}$$

to calculate the third thickness, $r_3$, of top electrode material to be removed to raise the second resonant frequency, $f_2$, on the BAW resonators on the production wafer by the third delta frequency, $f_{S3}$, to the third resonant frequency, f; and wherein the third thickness is less than the second thickness;

using the equation, $$r_4 = \frac{-C_1 \pm \sqrt{C_1^2 + 4C_2(f_t - f_1)}}{\frac{C_2}{2}} - r_2 - r_3$$

wherein $$C_1 = \frac{(f_2 - f_1)\left(\frac{r_2 + r_3}{r_2}\right) - (f_3 - f_1)\left(\frac{r_2}{r_2 + r_3}\right)}{r_3}$$

and wherein $$C_2 = \frac{(f_1 - f_2) - (f_1 - f_3)\left(\frac{r_2}{r_2 + r_3}\right)}{\frac{r_2}{r_3}}$$

to calculate the fourth thickness, $r_4$, of top electrode material to be removed to raise the third resonant frequency, $f_3$, on the BAW resonators on the production wafer to the target frequency, $f_t$.

13. A process of forming an integrated circuit with BAW resonators, comprising the steps:
  partially processing integrated circuit wafers with the BAW resonators through deposition of top electrode material on the BAW resonators with a thickness that results in an initial resonant frequency of the BAW resonators below a target frequency wherein one of the wafers is a calibration wafer and wherein other wafers are production wafers;
  measuring a resonant frequency, $f_{c0}$ on a portion of the BAW resonators on the calibration wafer;
  removing different amounts, $r_{ci}$ of top electrode material from different BAW resonators on the calibration wafer;
  re-measuring the resonant frequency, $f_{ci}$;
  plotting graph of a change in resonant frequency, $f_{sci}=f_{ci}-f_{c0}$, of BAW resonators as a function of the amount of top electrode material removed
  fitting a polynomial equation to the graph and determining polynomial coefficients wherein the polynomial equation is given by $r_{ci}=t(f_{sci})^6+u(f_{sci})^6+v(f_{sci})^6+w(f_{sci})^6+x(f_{sci})^6+y(f_{sci})^6+z$, wherein t, u, v, w, x, y, and z are polynomial coefficients, wherein $f_{sci}$ is the frequency shift caused by removal of $r_{ci}$ thickness of top electrode material, and wherein $r_{ci}$ is the thickness of top electrode material removed;
  measuring the initial resonant frequency of a portion of BAW resonators on production wafers;
  calculating a first thickness, $r_1$, of top plate material to be removed to raise the resonant frequency of the BAW resonators on a production wafer by a first delta frequency, $f_{S1}$, wherein the first delta frequency is less than half the frequency range between the target frequency and the initial resonant frequency, $f_0$, using the equation $r_1=t(fs_1)^6+u(fs_1)^5+v(fs_1)^4+w(fs_1)^3+x(fs_1)^2+y(fs_1)^1+z$;
  removing the first thickness from the production wafers by ion milling;
  measuring a first resonant frequency, $f_1$, of the BAW resonators;
  calculating a second thickness, $r_2$, of top electrode material to be removed to raise the resonant frequency of the BAW resonators on the production wafer by a second delta frequency, $f_{S2}$, wherein the second delta frequency is less than the first delta frequency, $f_{S1}$, using the equation $$r_2 = \frac{((fs_2)(r_1))}{(f_1 - f_0)};$$

removing the second thickness from the production wafers by ion milling;
  measuring a second resonant frequency, $f_2$, of the BAW resonators;
  calculating a third thickness, $r_3$, of top electrode material to be removed to raise the resonant frequency of the BAW resonators on the production wafer by a third delta frequency, $f_{S3}$, wherein the third delta frequency is less than the second delta frequency using the equation $$r_3 = \frac{-C_1 \pm \sqrt{C_1^2 + 4C_2(f_3 - f_0)}}{\frac{C_2}{2}} - r_2 - r_1$$

wherein $$C_1 = \frac{(f_1 - f_0)\left(\frac{r_1+r_2}{r_1}\right) - (f_2 - f_0)\left(\frac{r_1}{r_1+r_2}\right)}{r_2}$$

and wherein $$C_2 = \frac{(f_0 - f_1) - (f_0 - f_2)\left(\frac{r_1}{r_1+r_2}\right)}{\frac{r_1}{r_2}};$$

removing the third thickness from the production wafers by ion milling;
  measuring a third resonant frequency, $f_3$, of the BAW resonators;
  calculating a fourth thickness, $f_4$, of top electrode material to be removed to raise the resonant frequency of the BAW resonators on the production wafers to the target frequency, $f_t$;
  removing the fourth thickness from the production wafers by ion milling; and
  measuring a fourth resonant frequency, $f_4$, of the BAW resonators.

14. The process of claim 13, wherein the initial resonant frequency of the BAW resonators is approximately 5% to 7% below a target frequency specification, wherein the first resonant frequency of the BAW resonators is approximately 3% to 4% below target; wherein the second resonant frequency of the BAW resonators is approximately 2% to 3% below target; wherein the third resonant frequency of the BAW resonators is approximately 1 to 2% below target after a third cycle of ion milling, and wherein the fourth resonant frequency of the BAW resonators is within a target frequency specification range.

15. The process of claim 13, wherein the resonant frequency of the BAW resonators on the calibration wafer is about 5% to 7% below a target frequency specification and wherein different thicknesses top electrode material is removed from a series of stripes on the calibration wafer.

16. The process of claim 15 where the thickness of top electrode material removed is in increments of about 5 nm to 15 nm.

17. The process of claim 15 in the steps of calculating further comprising:
  determining a thickness of the top electrode material to be removed from BAW resonators on the production wafer whose resonant frequency is not by interpolation using the thicknesses to be removed on BAW resonators in the neighborhood whose resonant frequency is measured.

* * * * *